United States Patent
Abe

(10) Patent No.: US 7,371,475 B2
(45) Date of Patent: *May 13, 2008

(54) TARGET FOR TRANSPARENT CONDUCTIVE THIN FILM, TRANSPARENT CONDUCTIVE THIN FILM AND MANUFACTURING METHOD THEREOF, ELECTRODE MATERIAL FOR DISPLAY, ORGANIC ELECTROLUMINESCENCE ELEMENT AND SOLAR CELL

(75) Inventor: Yoshiyuki Abe, Chiba-ken (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 489 days.

This patent is subject to a terminal disclaimer.

(21) Appl. No.: 10/445,708

(22) Filed: May 27, 2003

(65) Prior Publication Data

US 2004/0013899 A1    Jan. 22, 2004

(30) Foreign Application Priority Data

May 30, 2002  (JP)  .............................. 2002-157568
Nov. 13, 2002  (JP)  .............................. 2002-330058

(51) Int. Cl.
  *B32B 33/00*  (2006.01)
  *H01B 1/08*  (2006.01)
(52) U.S. Cl. ................... 428/917; 428/918; 252/520.1; 252/521.3
(58) Field of Classification Search ........ 428/917–918; 252/521.3, 520.1
See application file for complete search history.

(56) References Cited

U.S. PATENT DOCUMENTS

| | | | | |
|---|---|---|---|---|
| 4,640,583 A | * | 2/1987 | Hoshikawa et al. | 349/153 |
| 5,907,382 A | * | 5/1999 | Kajiura et al. | 349/158 |
| 6,534,183 B1 | * | 3/2003 | Inoue | 428/432 |
| 6,689,477 B2 | * | 2/2004 | Inoue | 428/432 |

FOREIGN PATENT DOCUMENTS

| | | | |
|---|---|---|---|
| JP | 50-19125 | | 7/1975 |
| JP | 10-162959 | | 6/1998 |
| JP | WO0012445 | * | 3/2000 |
| JP | 2001-043980 | | 2/2001 |
| JP | 2002-275623 | * | 9/2002 |

* cited by examiner

*Primary Examiner*—Cathy F. Lam
(74) *Attorney, Agent, or Firm*—Katten Muchin Rosenman LLP

(57) ABSTRACT

The target for the transparent conductive thin film having indium oxide as its major component and containing tungsten and/or molybdenum, obtained by forming a body of indium oxide powder, and tungsten oxide power and/or molybdenum oxide powder and then heating or sintering the formed body such that the thin film after sputtering has indium oxide as the main component and contains tungsten and/or molybdenum with an atomic ratio (W+Mo)/In of 0.0040 to 0.0470, whereby a transparent conductive thin film having excellent surface smoothness and low specific resistance of $6.0\times10^{-4}$ $\Omega\cdot cm$ or less, and whose surface smoothness and specific resistance properties do not change even when heated at 170° C. is provided.

12 Claims, 4 Drawing Sheets

TARGET FOR TRANSPARENT CONDUCTIVE THIN FILM, TRANSPARENT CONDUCTIVE THIN FILM AND MANUFACTURING METHOD THEREOF, ELECTRODE MATERIAL FOR DISPLAY, ORGANIC ELECTROLUMINESCENCE ELEMENT AND SOLAR CELL

BACKGROUND OF THE INVENTION

1. Field of the Invention

This invention relates to a transparent conductive thin film that is used as a liquid-crystal display (LCD) element, organic electroluminescence (EL) element or solar cell display.

2. Description of the Related Art

Transparent conductive thin film has a high level of conductivity (for example, specific resistance of $1\times10^{-3}$ $\Omega \cdot cm$ or less) and a high transmission factor in the visible light range, so in addition to being used in the terminals of solar batteries, liquid-crystal display elements and other light-receiving elements, it is also used as; heat-reflective film for the window glass of automobiles and buildings; anti-static film; and as the transparent anti-fog heating element in refrigerated showcases.

Tin oxide ($SnO_2$) film doped with antimony or fluorine, zinc oxide (ZnO) film doped with aluminum or gallium, or indium oxide ($In_2O_3$) doped with tin have been widely used for transparent conductive thin film. Particularly, iridium oxide doped with tin, or in other words, $In_2O_3$—Sn type film, called ITO (Indium tin oxide), is often used because it can be easily made into a film having low resistance.

A sputtering method is often used as the method for manufacturing these transparent conductive thin films. The sputtering method is an effective method when using a material with low vapor pressure to form a film on an object hereafter called the 'substrate'), or when the thickness of the film must be precisely controlled, and it is widely used because operation is very simple.

The sputtering method is usually performed under conditions of argon gas at a pressure of 10 Pa or less and using the substrate as the anode and target as the cathode, between which a glow discharge occurs to generate argon plasma such that the positive argon ions in the plasma collide with the cathode target and break off the particles of The target and to deposit those particles on the substrate to form a film.

The sputtering method is classified by the method used to generate argon plasma, so a method that uses high-frequency plasma is called a high-frequency sputtering method, and a method that uses direct-current plasma is called a direct-current sputtering method Also, a method in which a magnet is placed behind the target to form a film by concentrating the argon plasma directly onto the target to improve the collision rate of the argon ions even under low gas pressure is called a magnetron sputter method. Normally, a direct-current magnetron sputter method is used as the method for manufacturing transparent conductive thin film.

A smooth transparent conductive film is necessary for the surface of the electrodes of an LCD or organic EL display Particularly, in the case of the electrodes for an organic EL display, an ultra-thin film made from organic compounds is formed on top, so a very smooth surface is necessary. Generally, surface smoothness is largely influenced by the crystallinity of the film. Even for film with the same composition, an amorphous film with no grain boundaries has very good surface smoothness.

In the case of the prior ITO structure, an amorphous ITO film that is formed by lowering the substrate temperature and performing sputtering at low temperature (150° C. or lower) and high pressure (1 Pa or greater) has excellent surface smoothness. However, the specific resistance of an amorphous ITO film is limited to $6\times10^{-4} \Omega \cdot cm$, and in order to form an electrode film having low surface resistance, the film itself must be made to be thick. When the film thickness of the ITO film is tick, a problem of film coloration occurs.

Also, in the case of an ITO film that is formed at room temperature without heating The substrate, when the sputter gas pressure is low, the kinetic energy of the sputter particles input to the substrate is high, so a localized temperature rise occurs, and a film is formed having a minute crystal phase and amorphous phase. In addition to X-ray diffraction, the existence of a minute crystal phase can be confirmed by using a transmission electron microscope or by electron beam diffraction. When this kind of minute crystal phase is formed in part of the film, the surface smoothness of the film is greatly affected. Moreover, when using a weak acid to perform etching removal to form the prescribed shape of the film, there is a problem in that it is not possible to remove just the crystal phase and some may remain.

Besides the problem with specific resistance, amorphous ITO film has a problem with stability. When an amorphous ITO film is used for the electrodes of an LCD or organic EL display, crystallization of the electrode film occurs when heating is performed at 150° C. or greater by thermal hysteresis during the manufacturing process after the electrode has been formed. This is because the amorphous phase is a metastable phase. When crystallization occurs, crystal grains are formed, and there is a problem in that the surface smoothness becomes poor and specific resistance varies greatly.

Next, the organic electroluminescence element will be explained. An electroluminescence element (hereafter abbreviated as EL element) employs electroluminescence, and since it is self emitting and so high in visibility and since it is a completely solid-state element, it is very impact resistant, therefore its use has gain much attention as a light-emitting element for all kinds of display devices. There are inorganic EL elements that use inorganic compounds as the light-emitting material, and there are organic EL elements that use organic compounds which includes polymer-type organic compounds. Of these, it is easy to make organic EL elements that are small in size and have a greatly lowered drive voltage, so research for application in next-generation display elements is actively being pursued. Organic EL elements are basically constructed with an anode, light-emitting layer and cathode, and are normally used for forming a transparent anode on a glass substrate or the like. In this case, light emission is performed on the substrate side.

Recently, for the reasons explained below, attempts have been made to make the anode transparent and to perform light emission from the anode side. First, by making the cathode transparent along with the anode, a totally transparent light-emitting element is possible. Any arbitrary color can be used as the background color of the transparent light-emitting element, which makes it possible to have a colorful display even when light is not emitted and thus improves appearance. Using black as the background color improves contrast during light emission. Next, when using a color filter or color transformation layer, it is possible to place it on top of the light-emitting element. Therefore, it is possible to manufacture the element without having to consider these layers. One advantage of this, for example, is that it is possible to raise the temperature of the substrate when forming the anode, and this makes it possible to lower the resistance of the anode.

Also, the advantage described above can also be obtained by making the cathode transparent, so attempts are being made to manufacture organic EL elements that use transparent cathodes. For example, the organic EL element disclosed in Japanese patent publication Tokukai Hei 10-162959 comprises an organic layer that includes an organic light-emitting layer located between an anode and cathode, and the cathode has a metal layer that is injected with electrons and an amorphous transparent conductive layer such that the electron-injection metal layer comes in contact with the organic layer. Also, in Japanese patent publication Tokukai 2001-43980, an organic EL element is disclosed in which the cathode is made to be transparent and a light-reflecting metal film is used for the anode, and light is effectively obtained from the cathode.

Next, the electron-injection metal layer will be explained. The electron-injection metal layer is a metal layer in which electrons can be injected in an organic layer that includes the light-emitting layer, and in order to obtain a transparent light-emitting element, it is preferable that the light transmittance be 50% or greater, and therefore it is preferable that the film thickness be ultra thin or about 0.5 to 20 nm. A metal (electron-injection metal) such as Mg, Ca, Ba, Sr, Li, Yb, Eu, Y or Sc having a work function of 3.8 cV or less and a thickness of 1 nm to 20 nm can be used as the electron-injection metal layer. In this case, it is preferred that the light transmittance be 50% or greater, and more preferably 60% or greater.

The organic layer between the anode and cathode includes at least a light-emitting layer. The organic layer can also be just a light-emitting layer, or together with the light-emitting layer it is possible to have multi-layer construction with layers such as an electron-hole transport layer. In the organic EL element, the organic layer can (1) have the function of injecting electron holes by the anode or electron-hole transport layer when an electric field is applied and the function of injecting electrons by an electron-injection layer; (2) have a transport function that moves the injected electric charge (electron and electron hole) by the force of the electric field; (3) provide a place inside the light-emitting layer for recombining the electrons and electron holes, and have a light-emitting function. The electron-hole injected transport layer is a layer made from an electron-hole transfer compound and has the function of transferring electron-holes that were injected by the anode to the light-emitting layer, and by placing this electron-hole injected transport layer between the anode and light-emitting layer, many electron holes can be injected into the light-emitting layer with a weaker electric field. In addition, the electrons that are injected into the light-emitting layer by the electron-injection layer are obstructed by an electron barrier that exists at the boundary between the light-emitting layer and the electron-hole transport layer and accumulate near the boundary in the light-emitting layer and improve the light-emitting efficiency of the EL element to make for an EL element with excellent light-emitting capability.

The anode is not particularly limited as long as the work function indicates conductivity of 4.4 eV or greater, more preferably 4.8 eV or greater. A metal, transparent conductive film (conductive oxide film) or a combination of these having a work function of 4.8 eV or greater is preferred. The anode does not necessarily have to be transparent, and can be coated with a black carbon layer or the like. Suitable metals include, for example, Au, Pt, Ni and Pd, and the conductive oxide can be, In—Zn—O, In—Sn—O, ZnO—Al or Zn—Sn—O. Also, combinations could include laminated layers of Au and In—Zn—O, Pt arid In—Zn—O, or In—Sn—O and Pt. Moreover, since the anode is suitable as long as the boundary with the organic layer has a work function of 4.4 eV or greater, the anode can be two layered, and a conductive layer having a work function of 4.4 eV or less can be used on the side that does not come in contact with the organic layer. In this case, a metal such as Al, Ta or W, or an alloy such as Al alloy or Ta—W alloy can be used. Also, it is possible to use a conductive polymer such as doped polyaniline or doped polyphenylenevinylene, or an amorphous semiconductor such as a-Si, a-SiC, or a-C, furthermore, a black semiconductive oxide such as $Cr_2O_3$, $Pr_2O_3$, NiO, $Mn_2O_5$ or $MnO_2$ etc.

It is preferable that the transparent conductive layer of the cathode in the organic EL element be an amorphous transparent conductive layer with low film stress and good smoothness. Also, in order to eliminate voltage drops and the unevenness in light emission that is caused by it, it is preferred that the specific resistance be $6\times10^{-4}\Omega\cdot cm$ or less.

Indium oxide film containing tungsten and/or molybdenum is well known. For example, Japanese patent publication Tokuko Sho 50-19125 discloses a technique of manufacturing an indium oxide film containing tungsten or molybdenum on a glass substrate heated to 350° C. by the electron-beam evaporation method. However, the aim of the indium oxide film containing tungsten or molybdenum of this disclosure is an indium oxide film with low resistance, and not that of improving the surface smoothness of the film or raising the crystallization temperature In this disclosure, nothing is mentioned about making an amorphous film or improving the surface smoothness of the film and it is not stated that the crystallization temperature of the film is raised by adding tungsten and/or molybdenum.

An amorphous film is not obtained by simply adding tungsten and/or molybdenum as in the case of the indium oxide film containing tungsten and/or molybdenum described in the disclosure mentioned above, and it is not possible to obtain an amorphous indium oxide film containing tungsten and/or molybdenum when the film is formed at 350° C. as described above. It is not possible to obtain an amorphous film by simply adding tungsten in this way, and neither is it possible to obtain a film with excellent surface smoothness as well as low resistance and high trasmissivity.

Obtaining a transparent conductive film with excellent surface smoothness and that is stable even in the thermal hysteresis of the manufacturing process was impossible using conventional ITO material, and thus it was difficult to use the film in the transparent electrodes of display elements such as an organic EL display or LCD.

SUMMARY OF THE INVENTION

An objective of this invention is to provide a transparent conductive thin film that is characterized by a low specific resistance of $6.0\times10^{-4}\Omega\cdot cm$ or less, and whose surface smoothness and specific resistance properties do not change by adding 170° C. heat in the annealing process.

Moreover, another objective of this invention is to provide a high-quality organic EL element that has brighter light emission and whose emission intensity has a longer half-life period, and in which it is more difficult for dark spots (non-emitting areas) to occur than an organic EL element that uses a conventional transparent conductive thin film.

Another objective of this invention is to provide a transparent conductive thin film which has indium oxide as its major component and contains tungsten and/or molybdenum with an atomic ratio (W+Mo)/In of 0.0040 to 0.0470, and it is formed with only an amorphous phase and in which excellent surface smoothness and low specific resistance of $6.0 \times 10^{-4} \Omega \cdot cm$ or less do not change even when heated at 170° C.

DESCRIPTION OF THE PREFERRED EMBODIMENTS

Figure 1:
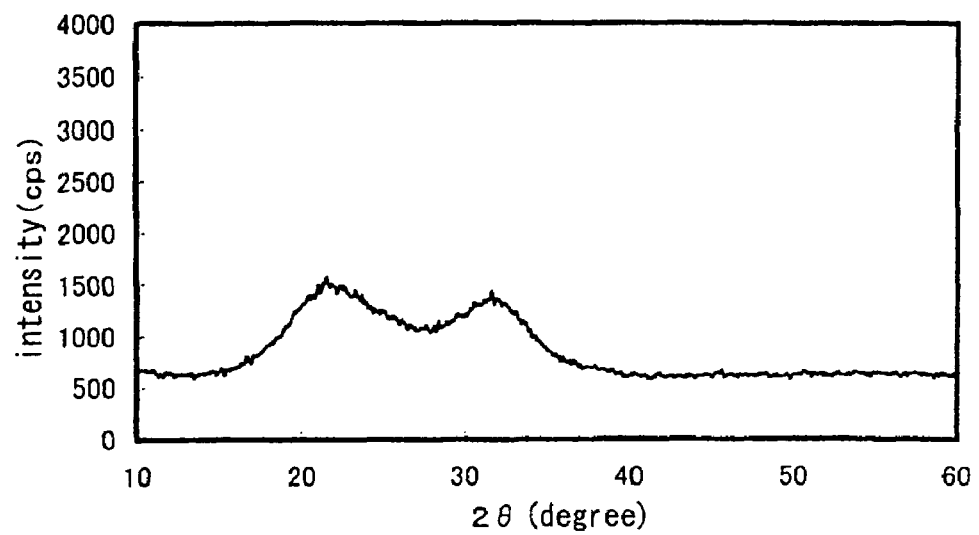
FIG. 1 is a diagram showing X-ray diffraction pattern of the transparent conductive thin film manufactured according to Example 2.

It is preferred that the thin film of the transparent conductive thin film of his invention be amorphous. However, in the manufacturing process of the thin film, it is possible that besides an amorphous thin film, the thin film could contain a minute amount of microcrystals (about 10 to 300 nm in size). In this case as well, the same effect can be obtained as long as the size or amount of the microcrystals is such that the crystal phase cannot be detected by X-ray diffraction. In this disclosure, the film, including the latter, will be evaluated as being amorphous.

This kind of thin film can be manufactured easily using a sputtering method without heating the substrate and by using a sintered target made of indium oxide containing a suitable amount tungsten and/or molybdenum.

Also, by using the low resistant, smooth and thermally stable transparent conductive thin film of this invention in a cathode and/or anode, the adhesion with the cathode and/or organic layer is improved, so it is possible to suppress the occurrence of dark spots, and since the resistance is low, it is also possible to eliminate voltage drops and unevenness in light emission caused by them, and thus a high-quality organic EL element can be obtained.

The target for the transparent conductive thin film of this invention, made from indium oxide containing tungsten and/or molybdenumn is obtained by preparing or forming indium oxide powder, and tungsten oxide power and/or molybdenum oxide powder and then heating or sintering the formation such that the thin film after sputtering has indium oxide as the main component and contains tungsten and/or molybdenum with an atomic ratio (W+Mo)/In of 0.0040 to 0.0470.

It is possible for the target of the present invention to include elements other than In, W, Mo, O e.g. in order to improve the sintering property of the target sintered body so long as the characteristics of the transparent conductive coating of the present invention are not deteriorated.

The manufacturing method of the transparent conductive thin film of this invention is a method of manufacturing the transparent conductive thin film on the substrate by a sputtering method where the substrate is kept at 120° C. or lower.

The transparent conductive thin film of this invention has indium oxide as the main component and contains tungsten and/or molybdenum with an atomic ratio (W+Mo)/In of 0.0040 to 0.0470, and is constructed from the non-crystalline phase.

Moreover, the non-crystalline phase is amorphous.

Furthermore, the specific resistance is $6.0 \times 10^{-4} \Omega \cdot cm$ or less.

The crystallization temperature by annealing is 180 to 290° C.

Also, the center line average height roughness (Ra) on the film surface is 2.0 nm or less.

The electrode material for a display of this invention is constructed from a transparent conductive thin film and glass substrate, and indium oxide is the main component and contains tungsten and/or molybdenum with an atomic ratio (W+Mo)/In of 0.0040 to 0.0470, and it is constructed from the non-crystalline phase, and the average visible light transmittance is greater than 85%.

Furthermore, the electrode material for a display of this invention is constructed firm a resin substrate with a coating of a silicon oxide, silicon oxynitride(SiON), diamond-like-carbon(DLC), or magnesium aluminate as a steam barrier formed on its surface, and the aforementioned transparent conductive tin film.

The organic electroluminescence element of this intention comprises an organic layer that is held between both the anode and cathode, and in the organic electroluminescence element, which includes the organic layer that emits light by recombining electron holes supplied from the anode with electrons supplied from the cathode, at least part of the anode and/or cathode is constructed using the aforementioned transparent conductive thin film.

The organic electroluminescence element of this invention includes polymertype one.

Also, the anode is constructed with a light-reflecting thin film, and the cathode is constructed with the aforementioned transparent conductive thin film, and light is mainly emitted from the cathode side.

The cathode can also constructed with a laminated transparent conductive thin film and metal thin film.

Moreover, an inorganic resin with an inorganic coating thereon is used as the substrate and the element is formed on it.

Furthermore, the inorganic coating is made of a silicon oxide, silicon oxynitride(SiON), diamond-like-carbon (DLC), or magnesium aluminate.

Also, the resin film used can be made of polyethersulfone or polyethersulfone laminated with acrylic resin.

The transparent conductive thin film of this invention is constructed of indium oxide and tungsten and/or molybdenum having an atomic ratio (W+Mo)/In of 0.0040 to 0.0470, and is constructed from the non-crystalline phase The reason that the range of atomic ratio of the tungsten and/or molybdenum in the film with respect to the indium is specified is because the resistance of the thin film that is obtained outside of that range increases.

It is possible for the transparent conductive thin film of the present invention to include elements other than In, W, Mo, O in order to improve the sintering property of the target sintered body so long as the characteristics of the transparent conductive coating of the present invention are not deteriorated.

Furthermore, in order to obtain an amorphous film with low resistance, not only is tungsten and/or molybdenum added, but it is necessary to for the film under suitable conditions, and particularly, it is essential that the substrate temperature be kept at 120° C. or lower and that sputtering be performed at a gas pressure of 0.3 Pa to 0.8 Pa.

From experiments performed by the inventors, it was made clear that for a thin film comprising indium oxide containing tungsten and/or molybdenum at an atomic ratio (W+Mo)/In of 0.0040 to 0.0470 constructed from the non-crystalline phase, not only is the surface smooth, but the resistance is low at $6.0\times10^{-4}$ Ω·cm or less, and these properties do not change even when heated at 170° C., or even from 180° C. to 290° C.

These thin films can be used on a substrate that uses a glass plate, resin plate, or resin film, or a resin plate or resin film whose surface is treated with a silicon oxide film, a silicon oxynitride film, magnesium aluminate film, or diamond-like-carbon (DLC) film. The resin is, for example, polyethylene, terephthalate (PET), polyethersulfone (PES), polyarylate (PAR), polycarbonate (PC) or one of these whose surface is covered with an acrylic organic material.

The transparent conductive thin film of this invention has a smooth surface and low resistance ($6.0\times10^{-4}$ Ω·cm or less), so its application in display devices such as an LCD or organic EL display can be very advantageous.

Improving the surface smoothness of the film and the raised temperature of crystallization (180° C. to 290° C.) was first accomplished by this invention.

EXAMPLES

Examples 1 to 16

Specified amounts of $In_2O_3$ powder. $WO_3$ powder and/or $MoO_3$ powder were nixed to form mixtures such that the atomic ratios (W+Mo)/In of the examples 1 to 16 shown in Table 1 were obtained for the thin film after manufacturing. The formed body was the heated or sintered to manufacture a sintered indium oxide containing tungsten body. This sintered body was then processed such that it was 4 inches (diameter)×5 mm (thickness), then an indium alloy was used to apply it to an oxygen-free copper back plate to form the sputtering target.

This sputtering target was attached to the cathode of non-magnetic target of a direct-current magnetron sputtering apparatus, and a 1.1 mm thick quartz glass substrate was attached to the surface facing the target. The distance between the target and the substrate was set to from 50 mm to 70 mm. As soon as the vacuum level inside the chamber reached $1\times10^{-4}$ Pa or lower, 99.9999 wt. % pure Ar gas was introduced into tie chamber until the gas pressure was 0.3 Pa to 0.8 Pa, and oxygen was introduced by an amount of from 0.5% to 3% into the Ar gas. Direct-current electric power from 100 W to 300 W was applied between the target and the substrate to generate direct-current plasma and to perform sputtering. A transparent conductive thin film with a film thickness of approximately 200 nm was formed on the substrate in this way. The substrate was not heated during sputtering. The specific resistance of each of the films depended on the gas pressure, amount of oxygen in the sputter gas, and the amount of direct-current power. Results of the films showing the lowest specific resistance values are shown in Table 1.

In this way, various indium oxide thin films containing tungsten and/or molybdenum were made using a sputtering method from a sintered target of indium oxide containing tungsten and/or molybdenum. The structure of the transparent conductive thin films obtained were quantitatively analyzed by ICP atomic emission spectrometry, and the film was checked for crystallinity by X-ray diffraction measurement using a CuK α beam, a transmission electron microscope and electron beam diffraction. Also, the specific resistance of each of the transparent conductive thin films was measured by the four-probe method, and the light transmittance including the substrate was measured using a spectrophotometer.

Moreover, the obtained transparent conductive thin films were annealed at 170° C. for one hour in atmospheric air. The changes in properties after annealing were investigated using the same methods described above.

The average light transmittance on the visible light wavelength range of the quartz substrates used in examples 1 to 7 of the invention was 92%. The measurement results of the composition and specific resistance values of the film before and after annealing are shown in Table 1.

TABLE 1

|  |  |  | Film before Annealing | | Film before Annealing | |
|---|---|---|---|---|---|---|
|  | Atomic Ratio W/In of Film | Atomic Ratio Mo/In of Film | Specific Resistance (Ω·cm) | Crystallinity | Specific Resistance (Ω·cm) | Crystallinity |
| Example |  |  |  |  |  |  |
| 1 | 0.0040 | 0 | $4.6\times10^{-4}$ | Amorphous | $4.8\times10^{-4}$ | Amorphous |
| 2 | 0.0063 | 0 | $3.4\times10^{-4}$ | Amorphous | $3.7\times10^{-4}$ | Amorphous |
| 3 | 0.0075 | 0 | $4.3\times10^{-4}$ | Amorphous | $4.8\times10^{-4}$ | Amorphous |
| 4 | 0.0095 | 0 | $4.6\times10^{-4}$ | Amorphous | $4.9\times10^{-4}$ | Amorphous |
| 5 | 0.0230 | 0 | $4.8\times10^{-4}$ | Amorphous | $5.1\times10^{-4}$ | Amorphous |
| 6 | 0.0342 | 0 | $5.2\times10^{-4}$ | Amorphous | $5.5\times10^{-4}$ | Amorphous |
| 7 | 0.0470 | 0 | $5.7\times10^{-4}$ | Amorphous | $6.0\times10^{-4}$ | Amorphous |
| 8 | 0 | 0.0042 | $4.8\times10^{-4}$ | Amorphous | $5.1\times10^{-4}$ | Amorphous |
| 9 | 0 | 0.0067 | $3.5\times10^{-4}$ | Amorphous | $3.9\times10^{-4}$ | Amorphous |
| 10 | 0 | 0.0076 | $4.5\times10^{-4}$ | Amorphous | $4.9\times10^{-4}$ | Amorphous |
| 11 | 0 | 0.0091 | $4.7\times10^{-4}$ | Amorphous | $5.2\times10^{-4}$ | Amorphous |
| 12 | 0 | 0.0252 | $5.0\times10^{-4}$ | Amorphous | $5.5\times10^{-4}$ | Amorphous |

TABLE 1-continued

| | Atomic Ratio W/In of Film | Atomic Ratio Mo/In of Film | Film before Annealing | | Film before Annealing | |
|---|---|---|---|---|---|---|
| | | | Specific Resistance (Ω · cm) | Crystallinity | Specific Resistance (Ω · cm) | Crystallinity |
| 13 | 0 | 0.0365 | $5.3 \times 10^{-4}$ | Amorphous | $5.7 \times 10^{-4}$ | Amorphous |
| 14 | 0 | 0.0462 | $5.5 \times 10^{-4}$ | Amorphous | $5.9 \times 10^{-4}$ | Amorphous |
| 15 | 0.0032 | 0.0036 | $3.2 \times 10^{-4}$ | Amorphous | $3.4 \times 10^{-4}$ | Amorphous |
| 16 | 0.0045 | 0.0067 | $4.5 \times 10^{-4}$ | Amorphous | $4.9 \times 10^{-4}$ | Amorphous |
| Comparative Example | | | | | | |
| 1 | 0.0023 | 0 | $8.3 \times 10^{-4}$ | Crystalline and Amorphous | $6.3 \times 10^{-4}$ | Crystalline |
| 2 | 0.0571 | 0 | $8.3 \times 10^{-4}$ | Amorphous | $8.9 \times 10^{-4}$ | Amorphous |
| 3 | 0.0650 | 0 | $9.7 \times 10^{-4}$ | Amorphous | $1.2 \times 10^{-3}$ | Amorphous |
| 4 | 0 | 0.0025 | $7.6 \times 10^{-4}$ | Crystalline and Amorphous | $6.1 \times 10^{-4}$ | Crystalline |
| 5 | 0 | 0.0510 | $8.9 \times 10^{-4}$ | Amorphous | $9.9 \times 10^{-4}$ | Amorphous |
| 6 | 0 | 0.0730 | $1.6 \times 10^{-3}$ | Amorphous | $2.2 \times 10^{-3}$ | Amorphous |
| 7 | 0.0015 | 0.0012 | $6.6 \times 10^{-4}$ | Crystalline and Amorphous | $5.9 \times 10^{-4}$ | Crystalline |
| 8 | 0.0290 | 0.0210 | $7.2 \times 10^{-4}$ | Amorphous | $7.9 \times 10^{-4}$ | Amorphous |

Figure 2:
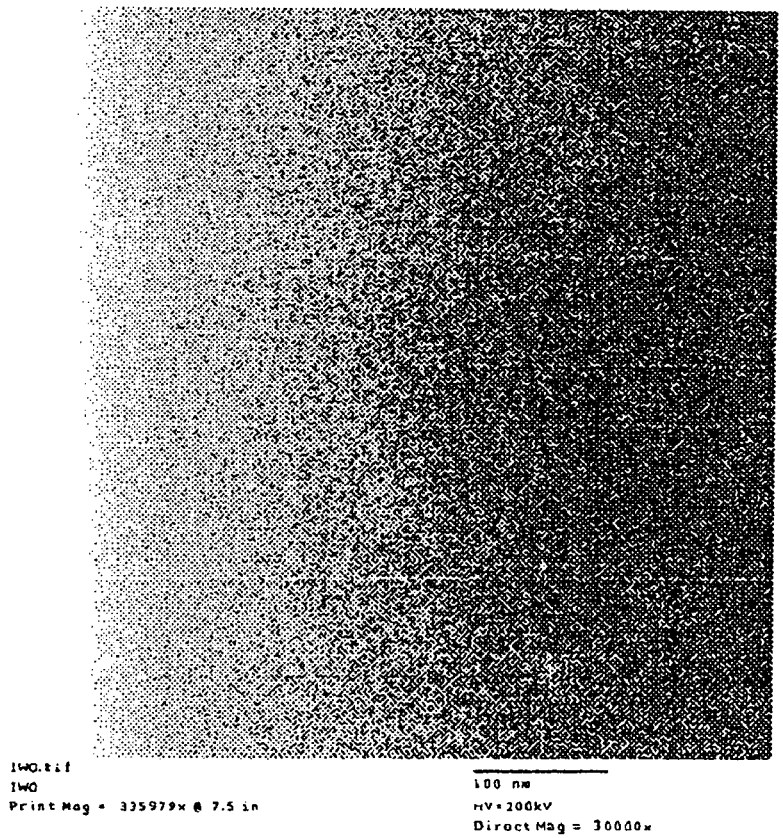
FIG. 2 is a transmission electron microscope photograph of the transparent conductive thin film manufactured according to Example 2.
Figure 3:
FIG. 3 is an electron beam diffraction diagram of the transparent conductive thin film manufactured according to Example 2.

As can be clearly seen from Table 1, the indium oxide thin film of this invention, containing tungsten and/or molybdenum at an atomic ratio (W+Mo)/In of 0.0040 to 0.0470, is a film constructed from just the amorphous phase and does not include the crystal phase and has low resistance of $6.0 \times 10^{-4} \Omega \cdot cm$ or less. The XRD pattern of example 2 is shown in FIG. 1, a transmission electron microscope photograph is shown in FIG. 2. and the electron beam diffraction diagram is shown in FIG. 3.

Also, crystallization did not occur for the films of examples 1 to 16 and the properties did not change even though annealing was performed at 170° C. X-ray diffraction measurement was performed while raising the temperature of the film at a rate of 5° C./min., to find the crystallization temperature of the films, and it was found to be 180 to 260° C. for the films of examples 1 to 16. The center line average height roughness (Ra) of a 1 μm×1 μm area was found by taking measurements at 10 arbitrary locations using an inter atomic force microscope and then calculating the average, and for all of the examples 1 to 16, the average was from 0.5 nm to 2.0 nm. Also, the average visible light transmittance, including the film substrate, was from 85% to 90%, which was good transmittance.

Generally, when forming the film, the substrate is heated naturally from the plasma. The substrate temperature during film formation was monitored using thermocouples, and by keeping the substrate temperature below 120° C., it was found that it was possible to obtain thin film having the properties of this invention.

Comparative Examples 1 to 8

As comparative examples, tin films were made under the same conditions as examples 1 to 16 except that the specified amounts of $In_2O_3$ powder and $WO_3$ and/or $MoO_3$ powder were adjusted such that the amount of tungsten and/or molybdenum contained in the thin film after manufacturing was outside the range for the atomic ratio (W+Mo)/In of this invention. The films obtained were evaluated using the same methods as for examples 1 to 16. The results are shown in Table 1.

The fills in comparative examples 1 to 3 are indium oxide films containing tungsten but no molybdenum, and for the film in comparative example 1 has an atomic ratio W/In of 0.0023, even though the substrate was formed without being heated, a minute crystal phase was contained in the film, and the center line average height roughness (Ra) on the surface of the film, which was measured as in the examples, was 3.8 nm and very rough. After annealing at 170° C., the film was completely crystallized.

Also, in the case of the film of comparative example 2 having an atomic ratio W/In of 0.0571, and the film of comparative example 3 having an atomic ratio W/In of 0.0650, the specific resistance was high and greater than $6.0 \times 10^{-4} \Omega \cdot cm$.

In comparative examples 4 to 6, the films were indium oxide film containing molybdenum but no tungsten, and for the film in comparative example 4 having an atomic ratio Mo/In of 0.0025, even though the substrate was formed without heating, a minute crystal phase was contained in the film, and the center line average height roughness (Ra) on the surface of the film, which was measured as in the examples, was 4.2 nm and very rough. After annealing at 170° C., the film was completely crystallized. Also, in the case of the film of comparative example 5 having an atomic ratio Mo/In of 0.0510, and the film of comparative example 6 having an atomic ratio Mo/In of 0.0730, the specific resistance was high and greater than $6.0 \times 10^{-4} \Omega \cdot cm$.

In comparative examples 7 and 8, the films were indium oxide films containing both tungsten and molybdenum, and in the case of the film in comparative example 7 having an atomic ratio (W+Mo)/In of 0.0027, even though the substrate was formed without heating, a minute crystal phase was contained in the film, and the center line average height roughness (Ra) on the surface of the film, measured as in the examples, was 4.1 nm and very rough. After annealing at 170° C., the film was completely crystallized Also, in the case of the film in comparative example 8 having an atomic ratio (W+Mo)/In of 0.0500. the specific resistance was high and greater than $6.0 \times 10^{-4} \Omega \cdot cm$.

Comparative Examples 9 to 10

A conventionally used sintered indium oxide target containing no impurities and a sintered indium oxide target containing tin (ITO) were used, and a non-doped indium oxide transparent conductive thin film (comparative example 9) and ITO transparent conductive thin film (comparative example 10) were made under the same conditions as the examples, and were evaluated in the same way as examples 1 to 3. The results are shown in Table 2. The composition of the thin film of comparative example 9 was analyzed by ICP and the atomic ratio Sn/In was found to be 0.075.

TABLE 2

|  | Film before Annealing | | Film after Annealing | |
| --- | --- | --- | --- | --- |
|  | Specific Resistance ($\Omega \cdot cm$) | Crystallinity | Specific Resistance ($\Omega \cdot cm$) | Crystallinity |
| Comparative Example 9 | $3.3 \times 10^3$ | Crystalline and Amorphous | $4.5 \times 10^3$ | Crystalline |
| Comparative Example 10 | $6.5 \times 10^4$ | Crystalline and Amorphous | $7.2 \times 10^4$ | Crystalline |

Figure 4:
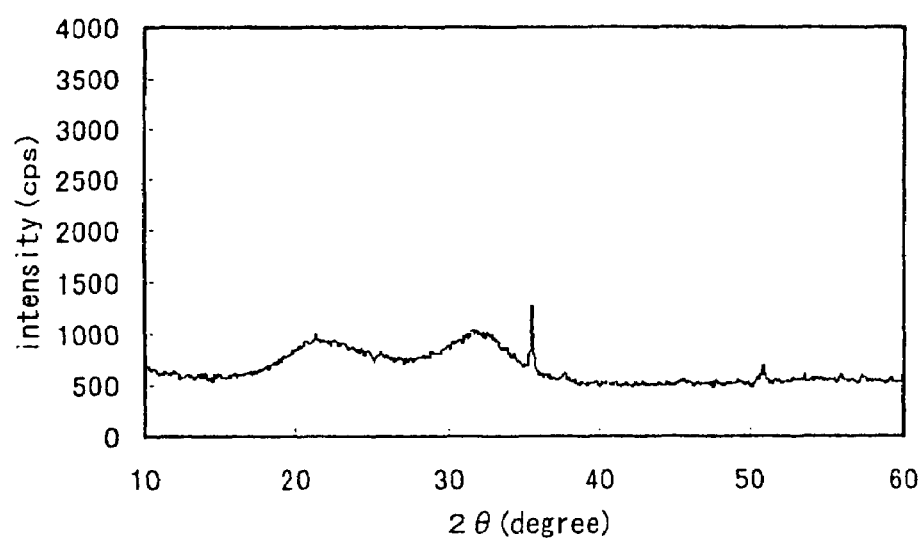
FIG. 4 is a diagram showing X-ray diffraction pattern of the transparent conductive thin film manufactured according to Comparative Example 10.

As shown in Table 2, the specific resistance of the indium oxide films of comparative example 9 and comparative example 10 was high. Also, both of the films contained a minute crystal phase in the film even though the films were formed by sputtering without heating the substrate The XRD pattern for comparative example 10 is shown in FIG. 4. It can be seen that the amorphous phase and crystalline phases coexist. In comparative example 10, from measurements using a transmission electron microscope and electron beam diffraction, it could also be seen that the amorphous phase and crystalline phase coexist. The center line average height roughness (Ra) on the surface of the films of comparative example 9 and comparative example 10, measured as in the examples, was from 5 nm to 6 nm, which was very large compared to examples 1 to 3. Also, the thin films of comparative example 9 and comparative example 10 were completely crystallized after annealing at 170° C. for one hour at atmospheric pressure, and the surface was extremely rough.

The substrate was changed from a glass substrate to a resin film with excellent surface smoothness, or a resin film that was treated with a silicon oxynitride film, and the film was manufactured in the same method, however the results were the same.

Example 17

When a 200 μm thick PES film was treated with a 57 nm thick silicon oxynitride film and 16 kinds of films were formed on top in the same ways as for examples 1 to 16, all of the films were amorphous, and the center line average height roughness (Ra), measured in the same way, was from 0.6 nm to 2.0 nm, the specific resistance was from $4.5 \times 10^{-4}$ to $5.9 \times 10^{-4}$ $\Omega \cdot cm$, and the average visible light transmittance was greater than 85%.

Example 18

Figure 5:
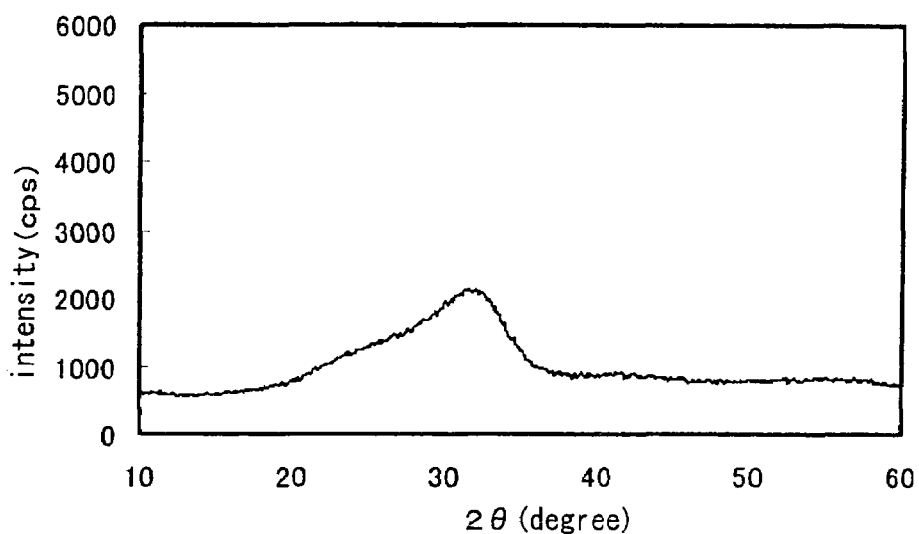
FIG. 5 is a diagram showing X-ray diffraction pattern of the transparent conductive thin film manufactured according to Example 8.
Figure 6:
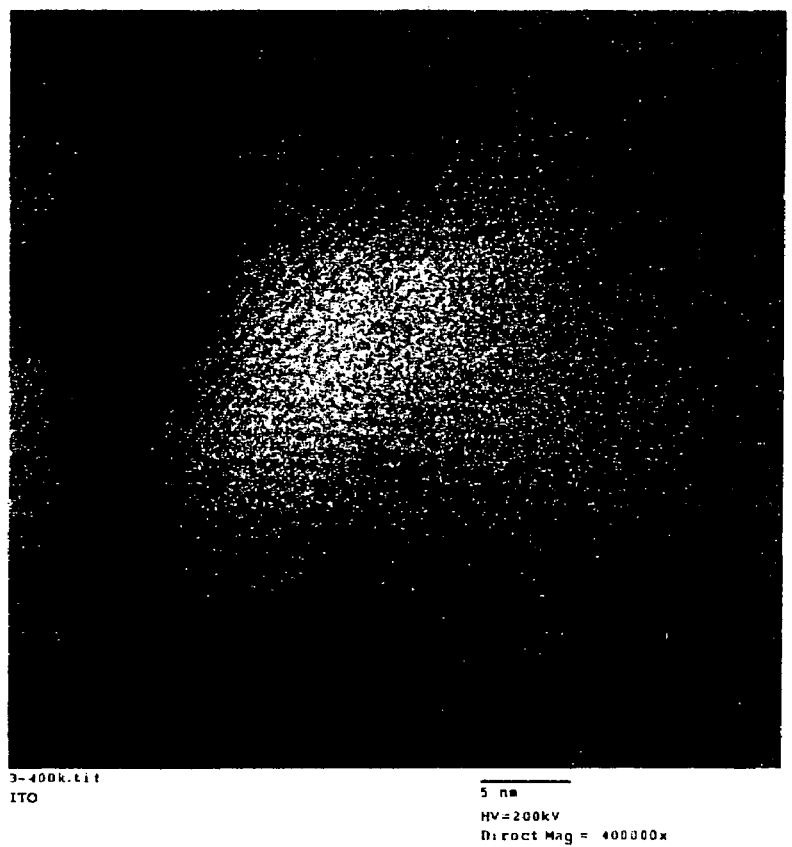
FIG. 6 is a transmission electron microscope photograph of the transparent conductive thin film manufactured according to Example 8.
Figure 7:
FIG. 7 is an electron beam diffraction diagram of the transparent conductive thin film manufactured according To Example 8.

Thin film was made under the same conditions as examples 1 to 16. X-ray diffraction measurement was performed for the obtained films and no crystal phase was detected, however, after checking using a transmission electron microscope and electron beam diffraction, it was found that a minute amount of microcrystals were contained in the film. The X-ray diffraction pattern of his film is shown in FIG. 5, the transmission electron microscope photograph is shown in FIG. 6, and the selected area electron diffraction diagram using a 1 nm (diameter) nano electron beam is shown in FIG. 7. This film was evaluated in the same way as for examples 1 to 16, and substantially the same properties as those of examples 1 to 16 were found.

Manufacturing an Organic EL Light-Emmitting Element

Example 19

The organic EL element of his invention was manufactured using the following procedure. An organic EL element that uses chrome with a work function of 4.5 eV as the metal anode is explained below. A chrome (Cr) film having a thickness of 200 nm was formed on a glass substrate 1 using DC sputtering. A 6-inch diameter chrome target was used, Argon (Ar) was used as the sputter gas, the pressure was 0.4 Pa and the DC output was 300 W. Normal lithography was used to pattern a specified shape. An anode having a specified shape was obtained in this way.

Next, a silicon oxide film ($SiO_2$) was formed as an insulating layer on the substrate processed with a chrome layer in a specified pattern. The $SiO_2$ is formed to a film thickness of 200 nm by oxygen-reactive sputtering using a Si target. Normal lithography is used to process the $SiO_2$ to form an opening in the chrome layer. A mixture of hydrofluoric acid and ammonium fluoride can be used to etch $SiO_2$. Also, it is possible to use dry etching. This opening will become the light-emitting section of the organic EL element.

Next, the glass substrate formed with a chrome and $SiO_2$ film is placed in a vacuum deposition apparatus in which an organic layer and metal anode layer are formed by vacuum deposition. Here, the organic layer used 4,4',4"-tris(3-methyl-phenyl-phenyl-amine) triphenyl-amine (MTDATA) as the electron-hole injecting layer, bis(N-naphthyl)-N-phenyl-benzidine(α-NPD) as the electron-hole transport layer, and 8-quinolinol aluminum complex (Alq) as the light-emitting layer. A magnesium and silver alloy (Mg:Ag) was used in the metal layer of the cathode K. An amount of 0.2 g of all of the materials of the organic layer were filled into a low-resistant heating boat and attached to the specified electrode of the vacuum deposition apparatus. An amount of 0.1 g of the magnesium and 0.4 g of silver of the metal layer were filled into a boat and attached to a specified electrode of the vacuum deposition apparatus Air was removed from the vacuum chamber until the vacuum level was $1.0 \times 10^{-4}$ Pa, after which voltage was applied to each boat to heat each in turn and to evaporate and deposit the contents. A metal mask was used to evaporate and deposit just a specified portion of the organic layer and the Mg:Ag metal layer The specified portion is a portion on the substrate where the chrome is exposed. Since deposition is very difficult to perform with high accuracy for just the exposed portion of the chrome layer, a deposition mask was designed that covered (covered the edges of the insulating layer) of the entire exposed portion of the chrome layer. First, 30 nm of MTDATA was deposited as the electron-hole injecting layer, then 20 nm of α-NPD was deposited as the electron-hole transport layers and 50 nm of Alq was deposited as the light-emitting layer. Furthermore, by depositing magnesium and silver together, an Mg:Ag film is formed on the organic layer as the metal layer 11 of the cathode K The ratio of formation speed of magnesium and silver was 9:1. The film thickness of the Mg:Ag film was 10 nm.

Finally, the substrate is moved to a different vacuum chamber where the transparent conductive layer is formed using the same mask. DC sputtering is used in formation of the film. Here, a transparent conductive thin film was formed having the In—W—O type composition of example 2. The conditions of film formation were a mixture of argon and oxygen (volume ratio Ar:$O_2$=99:1) as the sputter gas, a pressure of 0.6 Pa and DC power output of 160 W. The film thickness was 200 nm. As described above, the transparent conductive thin film that was manufactured and obtained in this way had good conductivity and transparency even though the film was formed at room temperature.

Lastly, a 200 nm $SiO_2$ protective film was formed to cover the surface of the transparent conductive film layer using sputtering, to obtain the organic EL light-emitting element. This organic EL light-emitting element comprises 16 picture elements (8×2) where 2×2 mm square elements (picture element) are spaced apart by 2 mm, and where each element has 2 parallel stripe-shaped negative electrodes and 8 parallel stripe-shaped positive electrodes that alternate with each other.

A direct-current voltage is applied to the obtained organic EL element in a $N_2$ atmosphere and driven continuously at a constant current density of 10 mA/$cm^2$, and the initial average light-emission brightness of 160 picture elements (10 elements), number of current leaks between electrodes, light emission half-life, and whether or not dark spots were generated during 200 hours from the start of light emission were investigated. The results are shown in Table 3.

Example 20

A 16-picture-element organic EL element was manufactured using the same method as that used in example 19 except the transparent conductive thin film used as the cathode had the In—Mo—O type composition of example 6. Similarly, the initial average light-emission brightness of 160 picture elements (10 elements), number of current leaks between electrodes, light emission half-life, and whether or not dark spots were generated during 200 hours from the start of light emission were investigated. The results are shown in Table 3.

Example 21

A 16-picture-element organic EL element was manufactured using the same method as that used in example 19 except the transparent conductive thin film used as the cathode had the In—Mo—O type composition of example 9. Similarly, the initial average light-emission brightness of 160 picture elements (10 elements), number of current leaks between electrodes, light emission half-life, and whether or not dark spots were generated during 200 hours from the start of light emission were investigated. The results are shown in Table 3.

Example 22

A 16-picture-element organic EL element was manufactured using the same method as that used in example 19 except the transparent conductive thin film used as the cathode had the In—W—Mo—O type composition of example 15. Similarly, the initial average light-emission brightness of 160 picture elements (10 elements), number of current leaks between electrodes, light emission half-life, and whether or not dark spots were generated during 200 hours from the start of light emission were investigated. The results are shown in Table 3.

Comparative Example 11

A 16-picture-clement organic EL element was manufactured using the same method as that used in example 19 except the transparent conductive thin film used as the cathode had the In—Sn—O type composition of comparative example 9. Similarly, the initial average light-emission brightness of 160 picture elements (10 elements) number of current leaks between electrodes, light emission half-life, and whether or not dark spots were generated during 200 hours from the start of light emission were investigated The results are shown in Table 3.

Comparative Example 12

A 16-picture-element organic EL element was manufactured using the same method as that used in example 42 except the transparent conductive thin film used as the cathode had the In—Sn—O type composition of example 10. Similarly, the initial average light-emission brightness of 160 picture elements (10 elements), number of current leaks between electrodes, light emission half-life, and whether or not dark spots (non-emitting spots) were generated during 200 hours from the start of light emission were investigated. The results are shown in Table 3.

Comparative Example 13

A 16-picture-element organic EL element was manufactured using the same method as that used in example 19 except a In—Zn—O type transparent conductive thin film was used for thc cathode. The In—Zn—O type transparent conductive thin film used a $In_2O_3$—ZnO (10 wt % ZnO) sintered target ad ww manufractured at room temperature using DC sputtering. Similarly, the initial average light-emission brightness of 160 picture elements (10 elements), number of current leaks between electrodes, light emission half-life, and whether or not dark spots (non-emitting spots) were generated during 200 hours from the start of light emission were investigated. The results are shown in Table 3.

TABLE 3

| | Average Light-Emission Brightness | Light-Emission Half-Life | Dark Spots |
|---|---|---|---|
| Example | | | |
| 19 | 430 cd/$m^2$ | 800 h | no dark spots |
| 20 | 410 cd/$m^2$ | 800 h | no dark spots |
| 21 | 410 cd/$m^2$ | 800 h | no dark spots |
| 22 | 440 cd/$m^2$ | 800 h | no dark spots |
| Comparative Example | | | |
| 11 | 150 cd/$m^2$ | 200 h | a lot of dark spots |
| 12 | 150 cd/$m^2$ | 250 h | a lot of dark spots |
| 13 | 350 cd/$m^2$ | 800 h | no dark spots |

As shown in Table 3, compared with an organic EL element using conventional materials (comparative examples 11 to 13), the organic EL element using the transparent conductive thin film of this invention (examples 19 to 22) have greater initial average light emission brightness, and the brightness half-life is clearly longer. Also, light emission of 400 cd/m² and greater was confirmed. The brightness half-life was 800 hours. Many dark spots (non-emitting spots) occurred 200 hours after the start of light emission in the organic EL elements using conventional materials. (comparative examples 8 and 9), however, there were absolutely no dark spots in the organic EL elements using the transparent conductive thin film of this invention (examples 19 to 22). Moreover, no dark spots (non-emitting spots) were seen in the organic EL element of comparative example 13 after a lapse of 200 hours from the start of light emission, and the brightness half-life was as long as that in examples 19 to 22 of the invention, however, the initial light emission brightness was less than that of the organic EL element of examples 19 to 22 It became clear from the comparative tests of the light transmittance of the In—Zn—O thin film and the thin film of this invention that the light transmittance of the In—Zn—O thin film used for the cathode was inferior, so it is thought that the light-emission brightness was lower. The metal Zn is contained in the In—Zn—O thin film and the light transmittance of about 400 nm of this film is inferior to that of the film of this invention.

Also, after the organic EL elements manufactured as described above were left for 100 hours in an atmosphere of 80° C. and 95% humidity, the same light-emission tests were performed and it was observed that many dark spots occurred at the start of light emission in the elements of comparative examples 11 to 13, however no dark spots were observed in the organic EL elements of examples 19 to 22 even 200 hours after the start of light emission. This is because of the good resistance to heat of the transparent conductive thin film of this invention.

Example 23

In examples 19 to 22, chrome was used for the anode, however the same tendencies were seen when tungsten, molybdenum, tantalum or niobium were used.

Example 24

Figure 8:
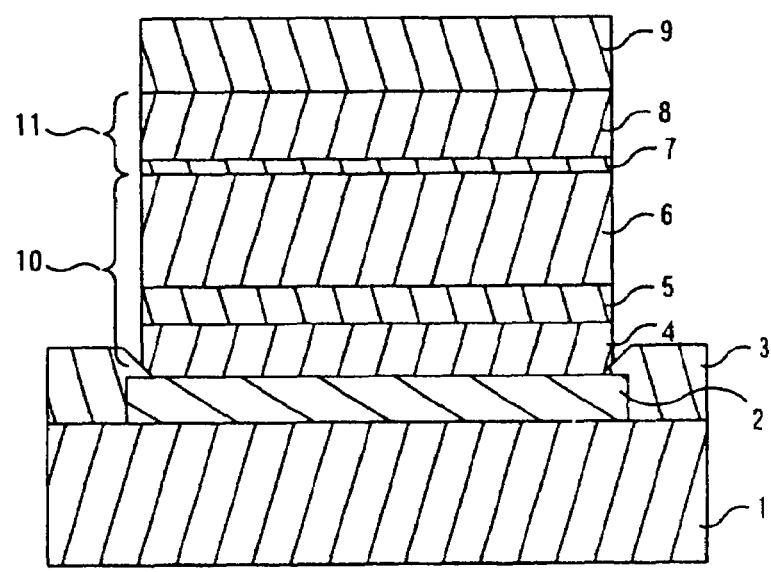
FIG. 8 is a cross sectional view showing a basic structure of organic EL element of this invention.

In examples 19 to 22, metal was used for the anode, however, in this example an organic EL element with the structure shown in FIG. 8 was manufactured using the same method as in examples 19 to 22 except for the In—W—O type amorphous thin film of examples 1 to 7 the In—Mo—O type amorphous thin film of examples 8 to 14 and the In—W—Mo—O type amorphous thin film of examples 15 and 16. In the case of this organic EL element, light emission is possible from the anode as well as the cathode. Light emission properties were investigated, and substantially the same good light emission properties were seen and no dark spots were observed even after a lapse of 200 hours from the start of light emission. However, in the case of an organic EL element that used the In—Sn—O type film of comparative examples 9 to 10 for the anode, many dark spots were observed after a lopse of 200 hours from the start of light emission.

Example 25

PES (polyethersulfone) formed with a 1 μm thick acrylic type hard coat layer (0.2 mm total film thickness) whose surface is treated with a 50 nm silicon oxynitride film was used as the substrate, and an organic EL element as shown in FIG. 1 was made on it. The In—W—O type amorphous thin film of examples 1 to 7, the In—Mo—O type amorphous thin film of examples 8 to 14, and the In—W—Mo—O type amorphous thin film of examples 15 and 16 were used for the anode and cathode, and the light-emission properties of the element were good.

As described above, this invention makes possible a transparent conductive tin film having excellent surface smoothness and low specific resistance of $6.0 \times 10^{-4}$ Ω·cm or less, and whose surface smoothness and specific resistance properties do not change even when heated at 170° C. The transparent conductive in film of this invention has these properties, so light can be efficiently obtained from an electrode, or in other words the cathode on the film, and thus it can be used for the cathode of an organic EL element having a high opening rate that is formed on top of a glass substrate formed with a TFT.

Also, the transparent conductive thin film of this invention can be formed on a low-temperature substrate into a transparent electrode having low resistance and good surface smoothness, so it can also be used for the cathode and/or anode of a flexible transparent organic EL element that uses resin film for the substrate.

The transparent conductive thin film of this invention is not limited to being used for an organic EL display, but can also be used in the transparent electrodes of an inorganic EL display, an LCD electronic paper, or a solar cell, so it can be said to have very high industrial value.

Moreover, an organic EL element that uses the transparent conductive thin film of this invention as high light-emission intensity and in which dark spots do not easily occur and thus making it is possible to manufacture a high-quality display, so this invention can be said to have high industrial value.

The invention claimed is:

1. An electrode material for a display constructed from a transparent conductive thin film and glass substrate, wherein the said transparent conductive thin film has indium oxide as its major component and contains tungsten, or tungsten and molybdenum with an atomic ratio (W+Mo)/In of 0.0040 to 0.0470, and constructed from a non-crystalline phase, and wherein the average visible light transmittance is greater than 85%, wherein the crystallization temperature by annealing is from 180° C. to 290° C.

2. A transparent conductive thin film having indium oxide as a main component and containing tungsten, or tungsten and molybdenum with an atomic ratio (W+Mo)/In of 0.0040 to 0.0470, and constructed from a non-crystalline phase, wherein the crystallization temperature by annealing is from 180° C. to 290° C.

3. The transparent conductive thin film described in claim 2, wherein the specific resistance is $6.0 \times 10^{-4}$ Ω·cm or less.

4. The transparent conductive thin film described in claim 2, wherein a center line average height roughness (Ra) on the film surface is 2.0 nm or less.

5. An electrode material for a display comprising a resin substrate with a steam baffler formed on the surface thereof, the steam baffler being selected from the group consisting of a silicon oxide, silicon oxynitride, and alumino magnesium, and a transparent conductive thin film described in claim 2.

6. An organic electroluminescence element comprising an anode, cathode and an organic layer that is held between the anode and cathode, wherein the organic layer includes an organic light emitting layer that emits light by recombining electron holes supplied from the anode with electrons supplied from the cathode, and wherein at least part of the anode and/or cathode is constructed using the transparent conductive thin film described in claim 2.

7. The organic electroluminescence element described in claim 6, wherein the anode is constructed with a light-reflecting thin film, and the cathode is constructed with the transparent conductive thin film described in claim 3, and wherein light is mainly emitted from the cathode side.

8. The organic electroluminescence element described in claim 6, wherein the anode is constructed with a light-reflecting thin film, and the cathode is constructed with a laminated transparent conductive thin film described in claim 2, and metal thin film, and wherein light is mainly emitted from the cathode side.

9. The organic electroluminescence element described in claim 6, wherein a resin film with an inorganic coating thereon is used as the substrate on which the element is formed.

10. The organic electroluminescence element described in claim 9, wherein the inorganic coating film is a silicon oxide coating, silicon oxynitride coating or magnesium aluminate coating.

11. The organic electroluminescence element described in claim 9, wherein the resin film is made of one of polyethersulfone, polycarbonate and polyethylene terephthalate.

12. The organic electroluminescence element described in claim 9, wherein the resin film is made of a body of one of polyethersulfone, polycarbonate and polyethylene terephthalate laminated with acrylic resin.

* * * * *